(12) United States Patent
Jeong

(10) Patent No.: US 7,532,535 B2
(45) Date of Patent: May 12, 2009

(54) APPARATUS AND METHOD FOR SUPPLYING POWER VOLTAGES IN ACTIVE AND STAND-BY MODES

(75) Inventor: Woo-Pyo Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 66 days.

(21) Appl. No.: 11/481,724

(22) Filed: Jul. 6, 2006

(65) Prior Publication Data

US 2007/0014177 A1    Jan. 18, 2007

(30) Foreign Application Priority Data

Jul. 15, 2005  (KR) ...................... 10-2005-0064380

(51) Int. Cl.
*G11C 11/00* (2006.01)
(52) U.S. Cl. ......................................... 365/226; 365/65
(58) Field of Classification Search .................. 365/226; 327/65
See application file for complete search history.

(56) References Cited

U.S. PATENT DOCUMENTS

| | | | | |
|---|---|---|---|---|
| 4,733,171 A | * | 3/1988 | Milkovic | .................... 324/142 |
| 4,903,226 A | * | 2/1990 | Tsividis | ....................... 708/801 |
| 5,280,455 A | | 1/1994 | Kanaishi | ..................... 365/229 |
| 5,751,651 A | * | 5/1998 | Ooishi | ......................... 365/226 |
| 6,343,044 B1 | * | 1/2002 | Hsu et al. | .................... 365/227 |
| 6,518,910 B2 | * | 2/2003 | Sakuragi et al. | ............. 341/162 |
| 6,785,183 B2 | | 8/2004 | Sivero et al. | ................. 365/226 |
| 7,098,638 B1 | * | 8/2006 | Herbert | ...................... 323/282 |
| 7,102,870 B2 | * | 9/2006 | Nerheim | ..................... 361/232 |
| 7,176,910 B2 | * | 2/2007 | Tsuchi | ........................ 345/204 |

OTHER PUBLICATIONS

Korean Patent Application No. 1020020019745 to Tomoaki, having Publication date of Oct. 19, 2002 (w/ English Abstract page).
Japanese Patent Application No. 2001-335554 to Hiroyuki et al., having Publication date of May 16, 2003 (w/ English Abstract page).

* cited by examiner

*Primary Examiner*—Michael T Tran
(74) *Attorney, Agent, or Firm*—Monica H. Choi

(57) ABSTRACT

A first voltage generator generates an active power voltage at a first power line having a decoupling capacitor coupled thereto. A second voltage generator generates a standby power voltage at a second power line. A switch is coupled between the first and second power lines. The switch is closed and the second voltage generator is disabled for an active mode of operation. The decoupling capacitor speeds up charging of the second power line to the active power voltage.

19 Claims, 6 Drawing Sheets

APPARATUS AND METHOD FOR SUPPLYING POWER VOLTAGES IN ACTIVE AND STAND-BY MODES

BACKGROUND OF THE INVENTION

This application claims priority to Korean Patent Application No. 2005-64380, filed on Jul. 15, 2005 in the Korean Intellectual Property Office, the disclosure of which is incorporated herein in its entirety by reference.

1. Field of the Invention

The present invention relates generally to generating power voltages, and more particularly to stably switching between different power voltages for active and stand-by modes of operation in a semiconductor device.

2. Description of the Related Art

A semiconductor device such as a semiconductor memory device operates in one of an active mode and a standby mode. Most of the inner circuits of the semiconductor memory device do not operate in the standby mode; however, all of the inner circuits typically operate in the active mode.

The semiconductor memory device operates with a lower standby power voltage in the standby mode, and operates with a higher active power voltage in the active mode because power consumption is desired to be minimized especially in the standby mode. In addition, the transition from the lower standby power voltage to the higher active power voltage is desired to be fast enough for proper operation of the semiconductor memory device.

SUMMARY OF THE INVENTION

Accordingly, embodiments of the present invention supply a lower standby power voltage with fast transition to a higher active power voltage.

For supplying power voltages according to an aspect of the present invention, a first voltage generator generates an active power voltage at a first power line having a decoupling capacitor coupled thereto. In addition, a second voltage generator generates a standby power voltage at a second power line, and a switch is coupled between the first and second power lines. The switch is closed and the second voltage generator is disabled during an active mode.

In one embodiment of the present invention, the second power line is coupled to an integrated circuit within a semiconductor device, and the active power voltage on the first power line is applied to the integrated circuit during the active mode.

In another embodiment of the present invention, the decoupling capacitor reduces a time for charging the second power line to the active power voltage when the switch becomes closed for transitioning to the active mode from the standby mode.

For the standby mode, the switch is opened and the second voltage generator is enabled. In that case, the second power line is coupled to an integrated circuit within a semiconductor device, and the standby power voltage is applied to the integrated circuit.

In an example embodiment of the present invention, the first voltage generator is a first buffer for buffering a first power voltage to generate the active power voltage, and the second voltage generator is a second buffer for buffering a second power voltage to generate the standby power voltage. The first and second buffers are implemented as a respective differential amplifier configured with a negative feed-back loop.

In a further embodiment of the present invention, the respective differential amplifier for the first buffer is biased with a bias voltage such that the first buffer is always enabled. Additionally, the respective differential amplifier for the second buffer is biased with a standby mode signal such that the second buffer is enabled only in the standby mode.

In another embodiment of the present invention, a third voltage generator is enabled to generate the active power voltage at the second power line during the active mode. The third voltage generator operates with higher current than the first voltage generator for enhanced speed performance.

In this manner, the decoupling capacitor stores charge for faster charging of the second power line to the active power voltage in transitioning from the standby mode to the active mode. In addition, the second voltage generator stably provides the lower standby power voltage for minimized power consumption in the standby mode.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, and 6 refer to elements having similar structure and/or function.

DETAILED DESCRIPTION OF THE INVENTION

Figure 1:
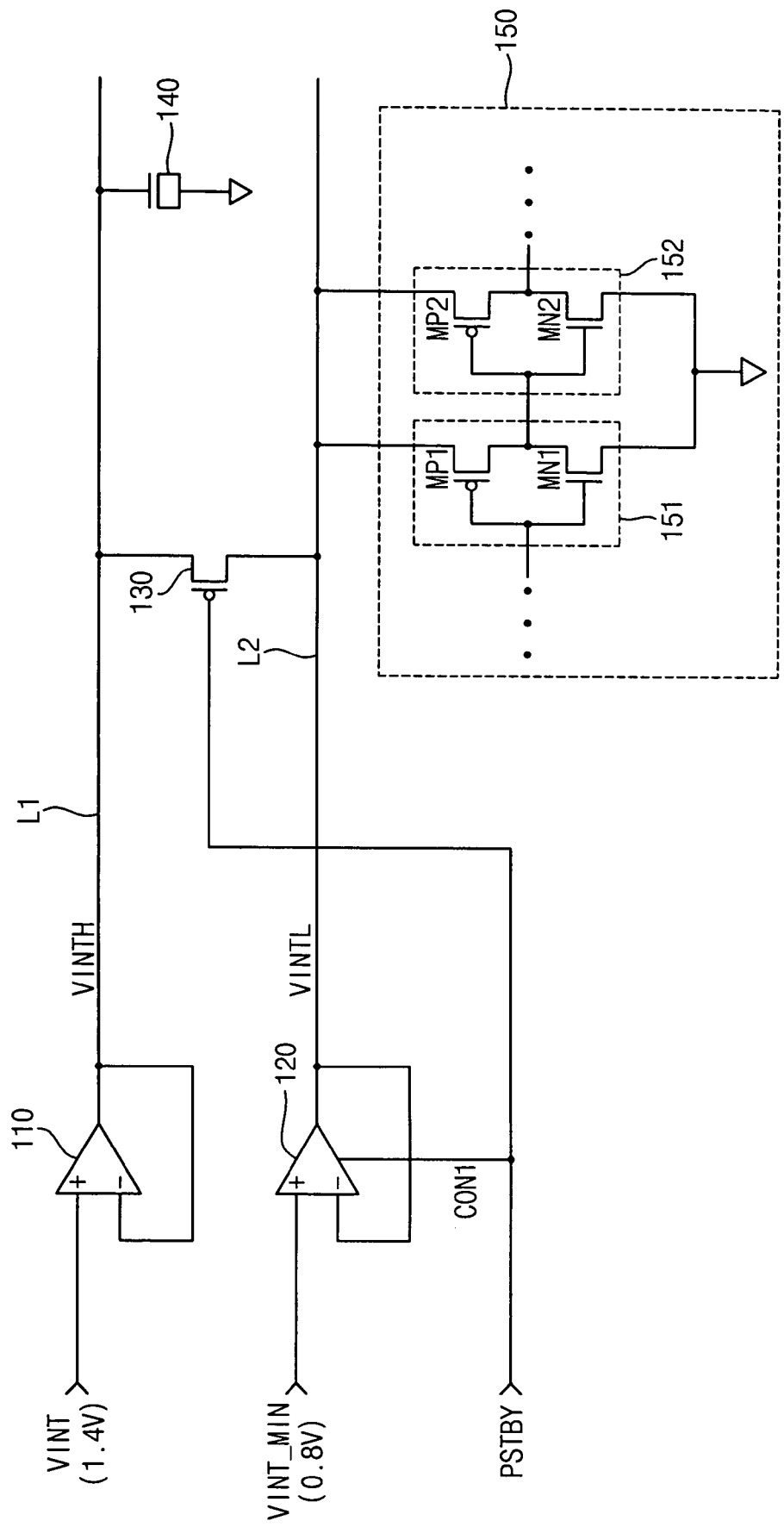
FIG. 1 shows a circuit diagram of a power supply circuit in a semiconductor memory device, according to one example embodiment of the present invention.

FIG. 1 shows a circuit diagram of a power supply circuit for generating power voltages applied on an internal integrated circuit within a semiconductor device such as a semiconductor memory device, according to one example embodiment of the present invention. Referring to FIG. 1, the power supply circuit includes a first buffer 110, a second buffer 120, a switch 130, and a decoupling capacitor 140.

The first buffer 110 is an example of a first voltage generator that provides a higher active power voltage VINTH. The second buffer 120 is an example of a second voltage generator that provides a lower standby power voltage VINTL during a standby mode.

The first buffer buffers a first power voltage VINT to generate the active power voltage VINTH at a first power line L1. The second buffer 120 buffers a second power voltage VINT_MIN to generate the standby power voltage VINL at a second power line L2 in response to a standby mode signal PSTBY.

The second power voltage VINT_MIN (such as 0.8 Volts for example) is lower than the first power voltage VINT (such as 1.4 Volts for example).

The switch 130 is implemented with a PMOSFET (P-channel metal oxide semiconductor field effect transistor), in one embodiment of the present invention. The PMOSFET 130 is coupled between the first and second power lines L1 and L2. The PMOSFET 130 turns on (i.e., is closed) to couple the first power line L1 to the second power line L2 when the standby mode signal PSTBY is deactivated in the active mode.

An internal integrated circuit 150 to be biased with one of the active power voltage or the standby power voltage is coupled to the second power line L2. In the example of FIG. 1, inverters 151 and 152 are illustrated as part of the example integrated circuit 150. Further referring to FIG. 1, the decoupling capacitor 140 is coupled to the first power line L1 and is charged to the active power voltage VINTH generated by the first buffer 110.

The operation of the power supply circuit of FIG. 1 is now described. The semiconductor device of FIG. 1 operates in one of the active mode or the standby mode at a time. In the standby mode, most of the internal integrated circuit 150 of the semiconductor memory device does not operate. Thus, the lower standby power voltage VINTL is desired to be applied on the internal circuit 150 in the standby mode for minimizing power consumption.

When the semiconductor memory device operates in the standby mode, the standby mode signal PSTBY is activated and the switch 130 is turned off (i.e., opened). Thus, the first power line L1 (and the first buffer 110) are decoupled from the second power line L2 and the internal circuit 150. In addition, the activated standby mode signal PSTBY is a first control signal CON1 that enables the second buffer 120 to operate for generating the standby power voltage VINTL on the second power line L2. Thus, the standby power voltage VINTL is applied on the internal circuit 150 during the standby mode.

When the semiconductor memory device transitions to operate in the active mode from the standby mode, the standby mode signal PSTBY is deactivated such that the switch 130 is turned on. In addition, the deactivated standby mode signal PSTBY as the first control signal CON1 disables the second buffer 120 to be turned off.

With the PMOSFET 130 turned on, the first power line L1 is coupled to the second power line L2 that is charged to the active power voltage VINTH. Before the PMOSFET 130 was turned on, the decoupling capacitor 140 is charged to the active power voltage VINTH. Such stored charge contributes to charging the second power line L2 to the active power voltage VINTH for faster transition time from the standby power voltage VINTL to the active power voltage VINTH on the second power line L2 in transitioning from the standby mode to the active mode. In this manner, the active power voltage VINTH is applied on the internal circuit 150 in the active mode.

Figure 2:
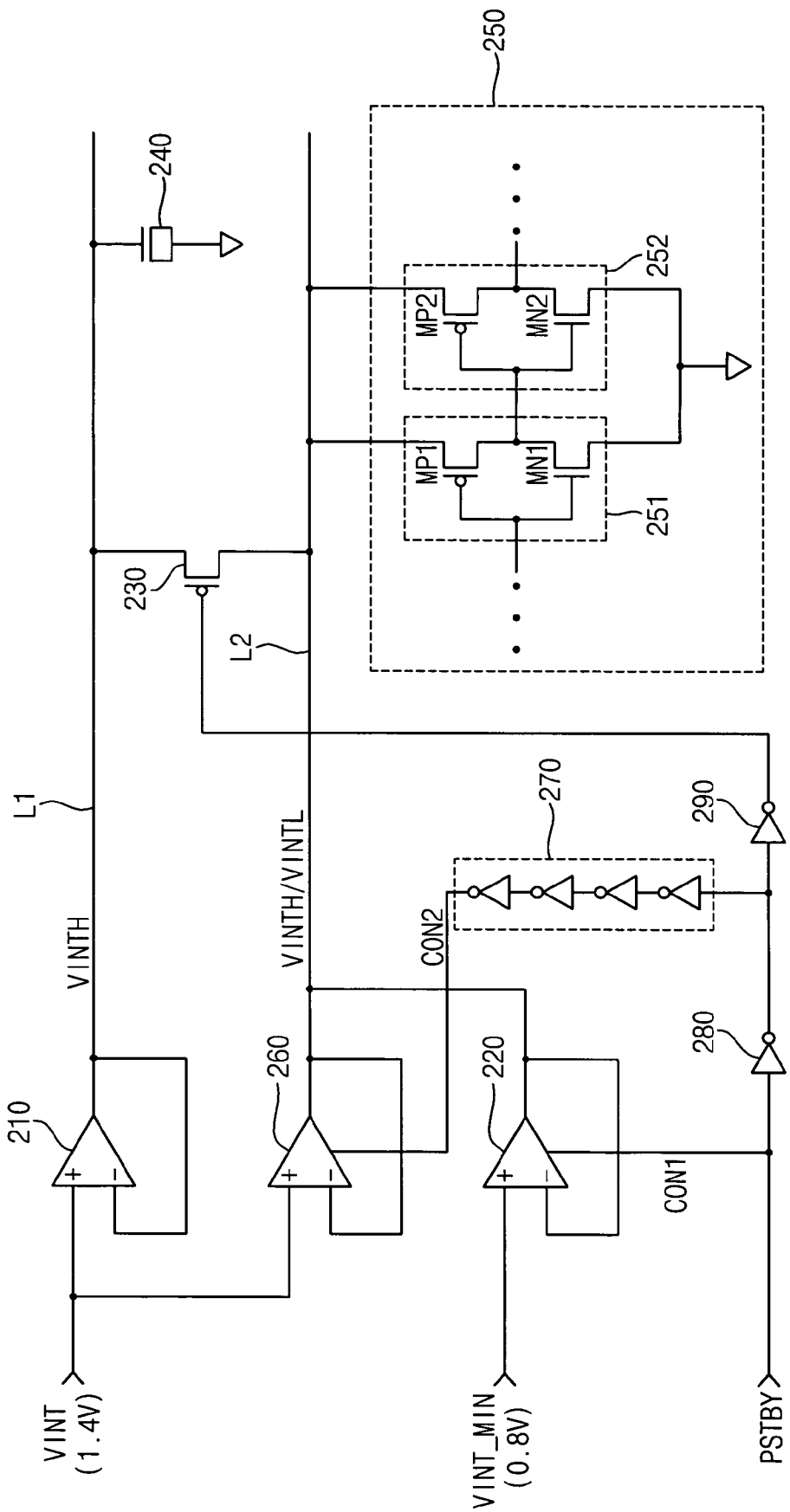
FIG. 2 shows a circuit diagram of a power supply circuit in a semiconductor memory device, according to another example embodiment of the present invention.

FIG. 2 shows a circuit diagram of a power supply circuit for generating power voltages within a semiconductor device such as a semiconductor memory device, according to another example embodiment of the present invention. Referring to FIG. 2, the power supply circuit includes a first buffer 210, a second buffer 220, a third buffer 260, a switch 230, a decoupling capacitor 240, a delay unit 270, and inverters 280 and 290.

The first and second buffers 210 and 220 generate the active power voltage VINTH and the standby power voltage VINTL, respectively, at first and second power lines L1 and L2, as similarly described in reference to FIG. 1. The first and second buffers 210 and 220, the switch 230, the decoupling capacitor 240, and the internal integrated circuit 250 operate similarly as described for similar named elements of FIG. 1. Thus, a detailed description of operation of such similar elements is not repeated.

However, the power supply circuit of FIG. 2 also includes the third buffer 260 that is an example of a third voltage generator that generates the active power voltage VINTH at the second power line L2 during the active mode. The third buffer 260 buffers the higher first power voltage VINT to generate the active power voltage VINTH.

The third buffer 260 is coupled to the second power line L2 to provide additional current driving capability at the second power line L2 coupled to the internal circuit 250 during the active mode. The third buffer 260 operates with higher bias current than the first buffer 210 in one embodiment of the present invention.

In addition, the output of the third buffer 260 is coupled directly to the second power line L2. On the other hand, the output of the first buffer 210 is coupled to the second power line L2 through the switch 230 which introduces a voltage drop between the output of the first buffer 210 and the second power line L2. In contrast, the active power voltage VINTH generated by the third buffer 260 is advantageously applied directly on the second power line L2 without any voltage drop.

For operation in the standby mode, the PMOSFET 230 is turned off by the standby mode signal PSTBY that is activated. In addition, the activated standby mode signal PSTBY acts as the first control signal CON1 that enables the second buffer 220 to operate for generating the standby power voltage VINTL applied on the internal circuit 250 in the standby mode.

Furthermore, the activated standby mode signal PSTBY is sent through the inverter 280 and the delay unit 270 to generate a second control signal CON2. Thus, the second control signal CON2 is the inverse of the standby mode signal PSTBY delayed through the delay unit 270 such that the second control signal CON2 is deactivated with a delay from when the standby mode signal PSTBY is activated.

The deactivated second control signal CON2 disables the third buffer 260 from generating the active power voltage VINTH at the second power line L2 in the standby mode. In this manner, the third buffer 260 is disabled with the delay through the delay unit 270 after the second buffer 220 is enabled with the activated standby mode signal PSTBY.

For transitioning to the active mode from the standby mode, the standby mode signal PSTBY is deactivated to turn on the PMOSFET 230 and to disable the second buffer 220. The second control signal CON2 is activated with the delay through the delay unit 270 from when the standby mode signal PSTBY is deactivated.

The activated second control signal CON2 enables the third buffer 260 to operate for generating the active power voltage VINTH at the second power line L2 in the active mode. In this manner, the third buffer 260 is enabled to operate with the delay through the delay unit 270 after the second buffer 220 is disabled. Such a delay ensures a smoother transition from the standby power voltage VINTL to the active power voltage VINTH at the second power line L2.

In addition for the active mode, the turned on PMOSFET 230 couples the first and second power lines L1 and L2. Thus, the active power voltage VINTH generated by the first and third buffers 210 and 260 is applied on the internal circuit 250 in the active mode.

Also in the embodiment of FIG. 2, before the PMOSFET 230 was turned on for the active mode, the decoupling capacitor 240 is charged to the active power voltage VINTH. Such stored charge contributes to charging of the second power line L2 to the active power voltage VINTH for faster transition time from the standby power voltage VINTL to the active power voltage VINTH at the second power line L2 in transitioning from the standby mode to the active mode.

Figure 3:
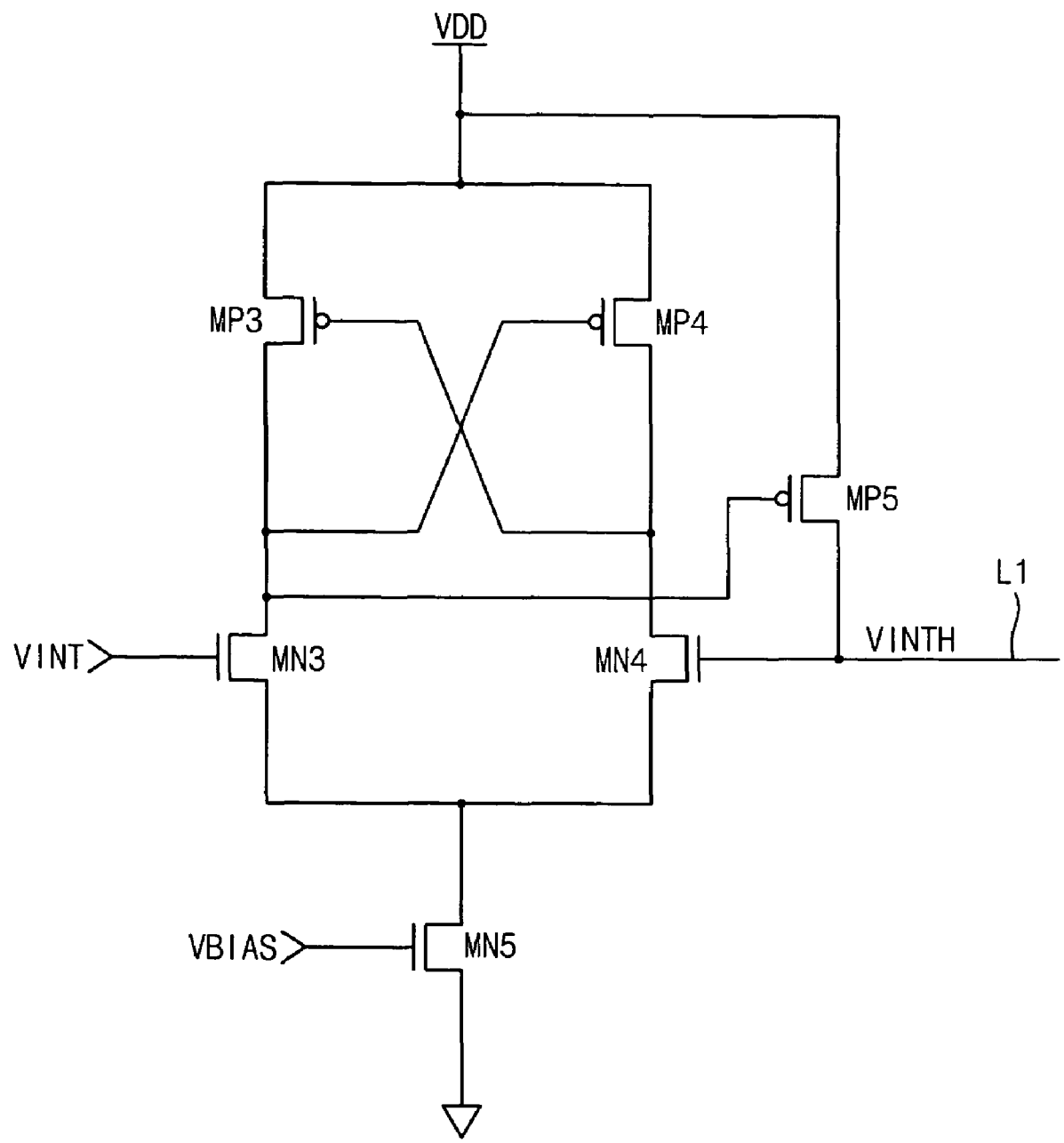
FIG. 3 shows a circuit diagram of a first buffer in the power supply circuit of FIG. 2, according to one example embodiment of the present invention.

FIG. 3 shows a circuit diagram of the first buffer 210 in the power supply circuit of FIG. 2, according to one example embodiment of the present invention. The first buffer 110 of FIG. 1 may also be implemented as illustrated in FIG. 3.

The first buffer 210 is implemented as a differential amplifier configured with a negative feed-back loop. Thus, the first buffer 210 includes a first NMOSFET (N-channel metal oxide semiconductor field effect transistor) MN3, a second MOSFET MN4, a third NMOSFET MN5, a first PMOSFET (P-channel metal oxide semiconductor field effect transistor) MP3, a second PMOSFET MP4, and a third PMOSFET MP5, configured as illustrated in FIG. 3.

The first and second NMOSFETs MN3 and MN4 are differentially coupled with the first and second PMOSFETs MP3 and MP4 forming loads to the first and second NMOSFETs MN3 and MN4. The third NMOSFET MN5 forms a biasing load that is biased with a biasing voltage VBIAS such that the first buffer 210 remains turned on to operate during both the active mode and the standby mode. The third PMOSFET MP5 is coupled in the negative feedback loop for stability in generating the active power voltage VINTH.

Figure 4:
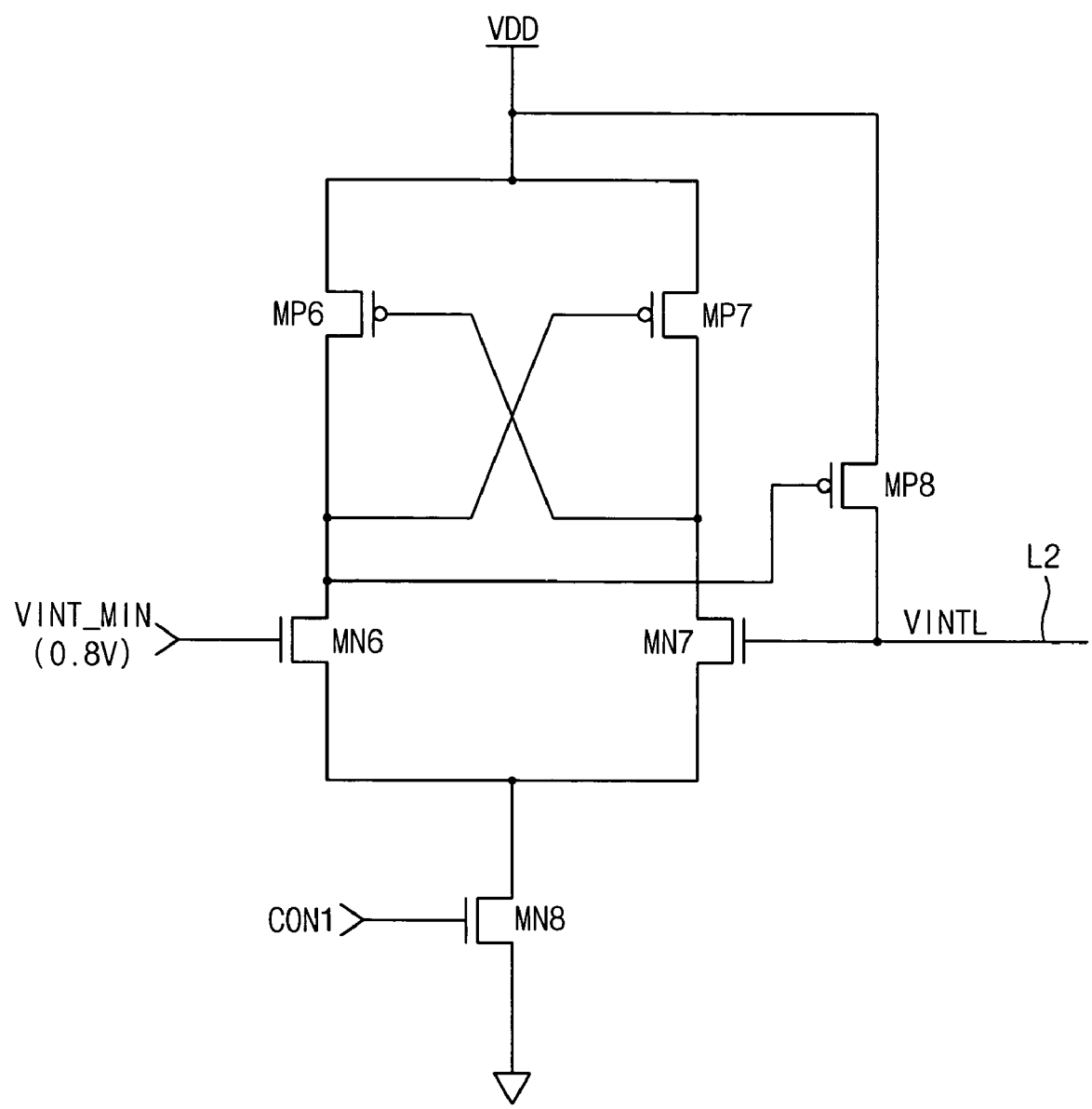
FIG. 4 shows a circuit diagram of a second buffer in the power supply circuit of FIG. 2, according to one example embodiment of the present invention.

FIG. 4 shows a circuit diagram of the second buffer 220 in the power supply circuit of FIG. 2. The second buffer 120 of FIG. 1 may also be implemented as illustrated in FIG. 4.

The second buffer 220 is implemented as a differential amplifier configured with a negative feed-back loop. Thus, the second buffer 220 includes a first NMOSFET MN6, a second NMOSFET MN7, a third NMOSFET MN8, a first PMOSFET MP6, a second PMOSFET MP7, and a third PMOSFET MP8, configured as illustrated in FIG. 4.

The first and second NMOSFETs MN6 and MN7 are differentially coupled with the first and second PMOSFETs MP6 and MP7 forming loads to the first and second NMOSFETs MN6 and MN7. The third NMOSFET MN8 forms a biasing load that is biased with the first control signal CON1 such that the second buffer 220 is disabled to be turned off for the active mode and enabled to operate in the standby mode. The third PMOSFET MP8 is coupled in the negative feedback loop for stability in generating the standby power voltage VINTL.

Figure 5:
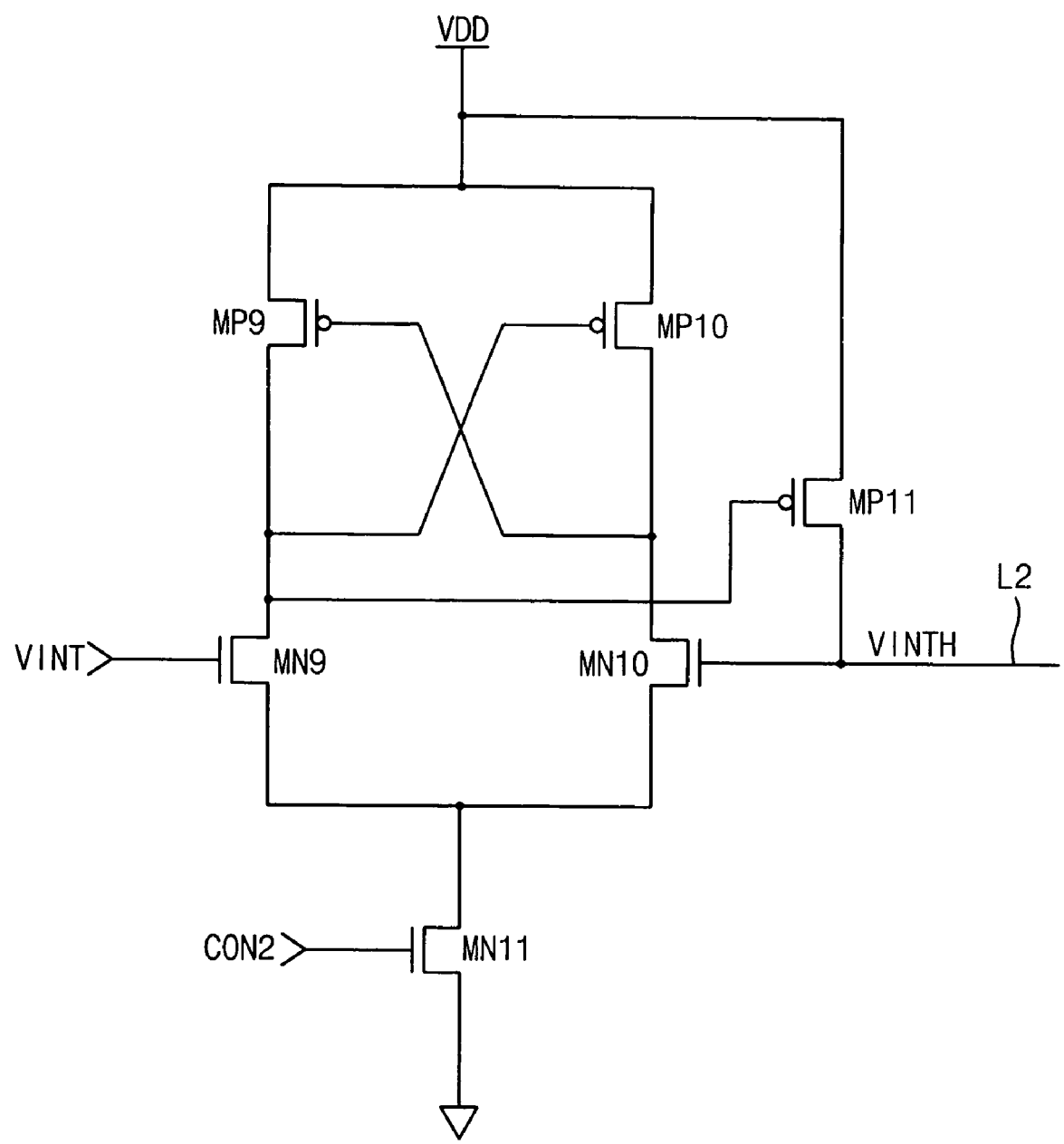
FIG. 5 shows a circuit diagram of a third buffer in the power supply circuit of FIG. 2, according to one example embodiment of the present invention.

FIG. 5 shows a circuit diagram of the third buffer 260 in the power supply circuit of FIG. 2. The third buffer 260 is implemented as a differential amplifier configured with a negative feed-back loop. Thus, the third buffer 260 includes a first NMOSFET MN9, a second NMOSFET MN10, a third NMOSFET MN11, a first PMOSFET MP9, a second PMOSFET MP10, and a third PMOSFET MP11, configured as illustrated in FIG. 5.

The first and second NMOSFETs MN9 and MN10 are differentially coupled with the first and second PMOSFETs MP9 and MP10 forming loads to the first and second NMOSFETs MN9 and MN10. The third NMOSFET MN11 forms a biasing load that is biased with the second control signal CON2 such that the third buffer 260 is enabled to operate for the active mode and disabled to be turned off in the standby mode. The third PMOSFET MP11 is coupled in the negative feedback loop for stability in generating the active power voltage VINTH.

Figure 6:
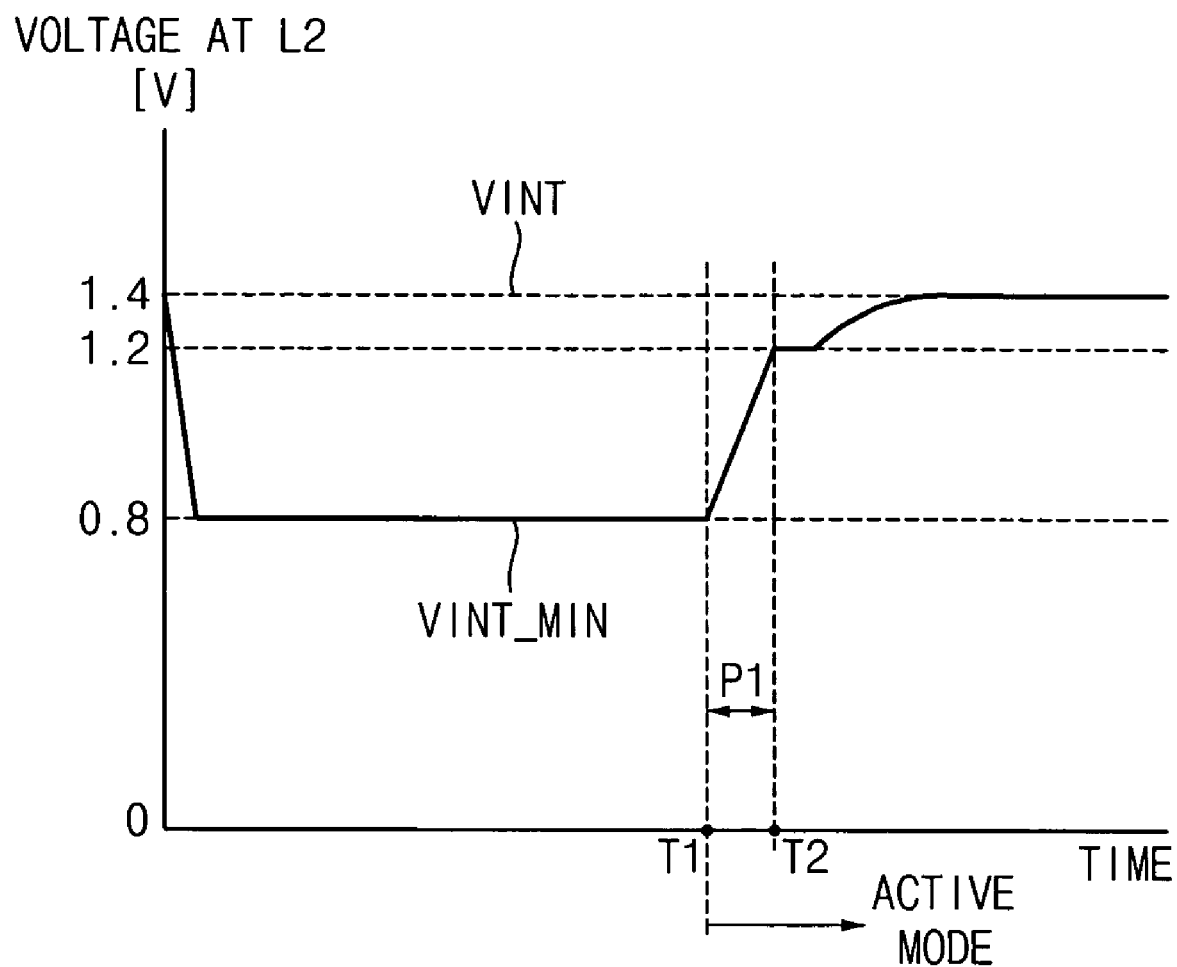
FIG. 6 shows a simulation graph of a power supply voltage outputted from the power supply circuit of FIG. 2.

FIG. 6 is a simulation graph that shows the voltage generated at the second power line L2 and applied on the internal circuit 250 in the power supply circuit of FIG. 2. Referring to FIG. 6, the lower second power voltage VINT_MIN (i.e., VINTL) is generated at L2 during a standby mode before time point T1. At time point T1, the mode of operation transitions from the standby mode to the active mode, and the standby mode signal PSTBY is deactivated at time point T1.

During time period P1 between time points T1 and T2, the second power line L2 is charged from the lower standby power voltage VINT_MIN (i.e., VINTL) toward the higher active power voltage VINT (i.e. VINTH). After the time point T2, the third buffer 260 generates the active power voltage VINT directly applied on the second power line L2. The time period P1 denotes the delay through the delay unit 270.

In this manner, the decoupling capacitor 140 or 240 stores charge for faster charging of the second power line L2 to the active power voltage VINTH in transitioning from the standby mode to the active mode. In addition, the second voltage generator 120 or 220 stably provides the lower standby power voltage VINTL for minimized power consumption in the standby mode.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, any specified numbers or number of elements or type of devices illustrated and described herein are by way of example only.

In addition, the present invention has been described for application within a semiconductor memory device. However, the power circuits of embodiments of the present invention may be applied within any type of semiconductor device operating in active and standby modes.

The present invention is limited only as defined in the following claims and equivalents thereof.

What is claimed is:

1. An apparatus for supplying power voltages, comprising:
   a first voltage generator for generating an active power voltage at a first power line;
   a decoupling capacitor coupled to the first power line;
   a second voltage generator for generating a standby power voltage at a second power line;
   a switch coupled between the first and second power lines;
   wherein the switch is closed and the second voltage generator is disabled during an active mode;
   and wherein the decoupling capacitor reduces a time for charging the second power line to the active power voltage when the switch becomes closed for the active mode,
   and wherein no current path is formed between the first power line and the second power line when the switch is opened.

2. The apparatus of claim 1, wherein the switch is opened and the second voltage generator is enabled for a standby mode.

3. The apparatus of claim 2, wherein the second power line is coupled to an integrated circuit within a semiconductor device, and wherein the standby power voltage is applied to the integrated circuit during the standby mode.

4. The apparatus of claim 1, wherein the first voltage generator is a first buffer for buffering a first power voltage to generate the active power voltage, and wherein the second voltage generator is a second buffer for buffering a second power voltage to generate the standby power voltage.

5. The apparatus of claim 4, wherein each of the first and second buffers is implemented as a respective differential amplifier configured with a negative feed-back loop.

6. The apparatus of claim 5, wherein each respective differential amplifier includes a transistor in the negative feed-back loop.

7. The apparatus of claim 5, wherein the respective differential amplifier for the first buffer is biased with a bias voltage such that the first buffer is always enabled.

8. The apparatus of claim 5, wherein the respective differential amplifier for the second buffer is biased with a standby mode signal such that the second buffer is enabled only in a standby mode.

9. The apparatus of claim 1, further comprising:
a third voltage generator for generating the active power voltage at the second power line when the third voltage generator is enabled during the active mode.

10. The apparatus of claim 9, wherein the third voltage generator operates with higher current than the first voltage generator.

11. The apparatus of claim 9, wherein a standby mode signal enables the second voltage generator in a standby mode, and wherein the apparatus further comprises:
a delay unit for coupling an inverse of the standby mode signal to the third voltage generator with a delay such that the third voltage generator is disabled with the delay after the second voltage generator is enabled for the standby mode.

12. The apparatus of claim 9, wherein the first voltage generator is a first buffer for buffering a first power voltage to generate the active power voltage, and wherein the second voltage generator is a second buffer for buffering a second power voltage to generate the standby power voltage, and wherein the third voltage generator is a third buffer for buffering the first power voltage to generate the active power voltage.

13. The apparatus of claim 1, wherein the switch is a field effect transistor that is turned on during the active mode and turned off during a standby mode.

14. A method of supplying power voltages, comprising:
generating an active power voltage at a first power line;
coupling a decoupling capacitor to the first power line such that the decoupling capacitor becomes charged to the active power voltage;
disabling a standby power voltage generator coupled to a second power line during an active mode; and
closing a switch coupled between the first and second power lines during the active mode,
wherein the decoupling capacitor reduces a time for charging the second power line to the active power voltage when the switch becomes closed for the active modes,
and wherein no current path is formed between the first power line and the second power line when the switch is opened.

15. The method of claim 14, wherein the second power line is coupled to an integrated circuit within a semiconductor device, and wherein the active power voltage on the first power line is applied to the integrated circuit during the active mode.

16. The method of claim 15, further comprising:
opening the switch and enabling the second voltage generator to generate a standby power voltage on the second power line during a standby mode.

17. The method of claim 15, further comprising:
generating the active power voltage at the second power line with an additional current source during the active mode.

18. The method of claim 17, further comprising:
disabling the generation of the active power voltage at the second power line with a delay after enabling the second voltage generator to generate a standby power voltage on the second power line for a standby mode.

19. The apparatus of claim 1, wherein the second power line is coupled to an integrated circuit within a semiconductor device, and wherein the active power voltage on the first power line is applied to the integrated circuit during the active mode.

* * * * *